United States Patent [19]
Honda

[11] Patent Number: 4,493,145
[45] Date of Patent: Jan. 15, 1985

[54] INTEGRATED CIRCUIT DEVICE HAVING EASILY CLEANED REGION BETWEEN MOTHER BOARD AND CHIP CARRIERS MOUNTED THEREON

[75] Inventor: Norio Honda, Aizuwakamatsu, Japan
[73] Assignee: Fujitsu Limited, Kawasaki, Japan
[21] Appl. No.: 542,570
[22] Filed: Oct. 19, 1983

Related U.S. Application Data
[62] Division of Ser. No. 201,484, Jun. 23, 1980, abandoned.

[30] Foreign Application Priority Data
Nov. 8, 1978 [JP] Japan .................. 53-153950

[51] Int. Cl.$^3$ .............................. H05K 3/34
[52] U.S. Cl. ................. 29/840; 174/52 FP; 361/386
[58] Field of Search ............ 29/840, 832, 825; 174/52 FP; 228/180 A, 201, 202; 361/381–386, 400, 412, 403

[56] References Cited
U.S. PATENT DOCUMENTS
3,777,220 12/1973 Tatusko et al. ............. 361/386 X
3,794,886 2/1974 Goldman ................. 361/386 X OTHER PUBLICATIONS
Separating Semi-Conductor Devices from Supporting Substrates, Roush and Sullivan, IBM Tech. Discl. Bull., vol. 16, No. 1, Jun. 1973, p. 41.

Primary Examiner—Howard N. Goldberg
Assistant Examiner—Carl J. Arbes
Attorney, Agent, or Firm—Staas & Halsey

[57] ABSTRACT

An integrated circuit device for realizing high integration density wherein a small size package called chip carrier (1) comprising a semiconductor integrated circuit element and providing connecting area at the perimeter of the rear side of said package is mounted onto a wiring board called mother board (2) providing connecting area corresponding to the connecting area of said small size package at the upper surface, characterized in that, contamination or dust existing in the gap between the upper surface of the mother board (2) and rear side of the chip carrier (1) can easily flow out and can be removed, thus improving reliability, by providing a through hole (7) at the chip carrier mounting area on said mother board (2).

3 Claims, 3 Drawing Figures

INTEGRATED CIRCUIT DEVICE HAVING EASILY CLEANED REGION BETWEEN MOTHER BOARD AND CHIP CARRIERS MOUNTED THEREON

This application is a division of application Ser. No. 201,484, filed June 23, 1980, now abandoned.

TECHNICAL FIELD

The present invention relates to an integrated circuit devide, particularly to an improvement in the package construction of an integrated circuit devide.

BACKGROUND ART

As one of the integrated circuit devices, known in order to realize a high integration density mounting is such construction that single or plurality of integrated circuit elements (chips) are built into a small size ceramic package called the chip carrier, plurality of said chip carriers are mounted on a ceramic wiring board called a mother board, and these are electrically connected by soldering etc.

In such integrated circuit devices having such construction, said chip carrier is usually electrically connected by soldering the electrode material formed at the rear surface or the perimeter of a side of the chip carrier and the electrode material formed on an upper surface of the mother board, without using external connecting terminals.

Said chip carrier and mother board are assembled into an integrated unit by the following process. Namely, the chip carrier and mother board are dipped into the melting solder respectively, then solder pad is formed on the electrode material and solder pads of both chip carrier and mother board are located for positioning and heated for soldering.

FIG. 1 shows a part of cross section of a conventional integrated circuit device where a chip carrier and mother board are built into a single unit by soldering. In this figure, 1 denotes a chip carrier; 2 denotes a mother board; 3 denote soldered electrodes; 4 indicate external connecting terminals led out from the mother board 2.

In this construction where the electrode material is directly soldered, a gap between the rear side (lower side) of the chip carrier and the upper side (surface) of the mother board is very narrow, and when the flux used in the soldering is remained or dust exists in such gap, it is difficult to remove such contamination or dust by the cleaning using ordinary organic solvent.

Because the organic solvent does not circulate sufficiently into such a narrow gap in such a cleaning method that contamination or dust is solved and removed when an integrated device is dipped into the circulating solution of an organic solvent of the trichloroethylene or Freon etc. which is a fusible agent of flux or into the gaseous ambient of the organic solvent. In addition, when mounting a mother board loading a chip carrier on to a printed wiring board comprising a polymer resin, the external connecting terminals of mother board are dipped into the fused solder for the purpose of solder coating. Such solder coating brings about a problem that flux and fused solder migrate into said narrow gap between the mother board and chip carrier through a space between the external connecting terminals and said printed wiring board.

Thereby the relevant integrated circuit devices have resulted in short circuit between electrodes and increase of leak current.

DISCLOSURE OF INVENTION

An object of the present invention is to provide such construction in an integrated circuit device with high integration density where a chip carrier including a semi-conductor element and having the connecting area at the perimeter of the rear side is mounted on to a printed wiring board having corresponding connecting area at its upper surface that contamination or dust remaining in the gap between rear side of said chip carrier and upper surface of mother board can be removed easily.

Abovementioned object can be achieved by providing a through hole at the chip carrier mounting areas of the mother board which is a printed wiring board.

Here, the mother board is provided with an electrode pattern corresponding to the connecting area of the chip carrier at the upper surface of the ceramic substrate, an internal wiring to be connected to said electrode pattern and external connecting terminals for leading out said internal wirings.

In such a condition that a chip carrier housing a semiconductor element and having connecting area at the perimeter of the rear side is mounted on to the mother board having said through hole, said through hole is located below the rear side of the chip carrier. Contamination of flux and dust generated through said through hole while connection between the electrode on the upper surface of mother board and electrode at the rear side of chip carrier can be removed very easily by the cleaning process for fusing and removing such contamination or dust with an organic solvent, for example, of trichloroethylene or Freon etc. Therefore, leak current between electrodes or short circuit trouble which are likely to occur due to existence of said flux or dust can drastically be reduced, and thus reliability of said integrated circuit device can be improved.

Moreover, in an integrated circuit device of the present invention, cooling characteristic of an integrated circuit device can drastically be improved by making possible to allow inflow of cooling medium into a through hole of the mother board under the rear side of the chip carrier.

BEST MODE FOR CARRYING OUT THE INVENTION

A preferred embodiment of the present invention will be explained hereunder, by referring to the attached drawings.

Figure 1:
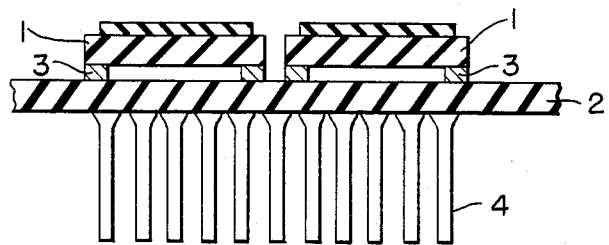
FIG. 1 shows a partical cross section of construction of a conventional integrated circuit device.
Figure 2:
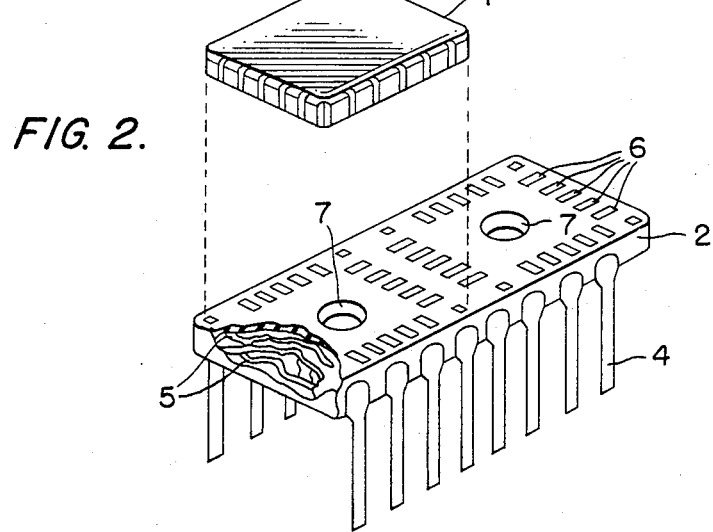
FIG. 2 shows a perspective view of construction of an integrated circuit device of the present invention.

FIG. 2 is a partial perspective view of an embodiment of the present invention, indicating that a chip carrier 1 and mother board 2 are still not soldered.

The chip carrier 1 comprises single or plurality of semiconductor integrated circuit elements (chips) and also provides electrode solder pad which is formed by dipping into the fused solder at the perimeter of the rear side.

The mother board 2 provides electrode solder pad 6 formed by dipping into fused solder at the location corresponding to the electrode solder pad at the rear side of the chip carrier 1 on the ceramic substrate surface on which internal wiring 5 is provided for the connection with an external connection terminal 4, and also provides a through hole 7 at the inside of said electrode solder pad 6.

Figure 3:
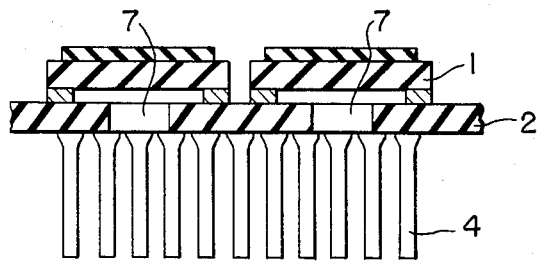
FIG. 3 shows a cross section of the mounting construction of an integrated circuit device of the present invention.

FIG. 3 shows a condition where said chip carrier 1 shown in FIG. 2 is mounted onto said mother board 2 and they are integrated into a device by being heated until said electrode solder pad is fused in the heating furnace or on the hot plate.

As shown in FIG. 3, said through hole 7 provided on the mother board 2 is located under the rear side of the chip carrier 1 in such a condition that the chip carrier 1 is mounted onto the mother board 2.

When the cleaning is performed by using an organic solvent of, for example, trichloroethylene or Freon etc. in such a condition that the chip carrier 1 is mounted to the mother board 2 and then integrated into a device, contamination or dust like flux existing in the gap between the surface of mother board 2 and rear side of the chip carrier 1 flows out through said through hole 7 and can easily be removed.

According to the present invention, since a through hole is provided at the chip carrier mounting area on the mother board used as the printed wiring board, contamination or dust like flux existing in the narrow gap between the mother board and chip carrier can easily be removed only by simple cleaning process, and moreover the present invention thereby can offer an integrated circuit device having high reliability where current leak or short circuit trouble caused between electrodes due to contamination or dust like flux and drastically be reduced.

I claim:

1. A method for making an integrated circuit device, comprising the steps of:
    forming solder pads on the bottom side of a chip carrier;
    forming corresponding solder pads on the top side of a mother board;
    positioning the chip carrier on the mother board so that the solder pads of the chip carrier are adjacent the corresponding solder pads of the mother board;
    heating the solder pads to melt the solder and join the corresponding solder pads; and
    circulating solvent between the chip carrier and the mother board through an opening in the mother board.

2. The method of claim 1, wherein the step of circulating solvent through an opening in the mother board is accomplished by dipping the mother board into a circulating solution of organic solvent.

3. The method of claim 1, wherein the step of circulating solvent through an opening in the mother board is accomplished by exposing the mother board to organic solvent fumes.

* * * * *